(12) United States Patent
Wyatt et al.

(10) Patent No.: US 7,583,116 B2
(45) Date of Patent: Sep. 1, 2009

(54) HIGH OUTPUT RESISTANCE, WIDE SWING CHARGE PUMP

(75) Inventors: Stephen D. Wyatt, Jericho, VT (US); Tian Xia, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 11/833,500

(22) Filed: Aug. 3, 2007

(65) Prior Publication Data
US 2009/0033383 A1 Feb. 5, 2009

(51) Int. Cl.
*H03L 7/06* (2006.01)
(52) U.S. Cl. ............. 327/157; 327/149; 327/536
(58) Field of Classification Search ........... 327/148, 327/157, 543, 536
See application file for complete search history.

(56) References Cited

U.S. PATENT DOCUMENTS

| | | | | |
|---|---|---|---|---|
| 3,268,827 A * | 8/1966 | Carlson et al. | ............ | 330/277 |
| 3,789,312 A * | 1/1974 | Heller et al. | ............ | 330/277 |
| 4,284,959 A * | 8/1981 | Heagerty et al. | ............ | 330/253 |
| 5,801,578 A | 9/1998 | Bereza | | |
| 6,177,827 B1 * | 1/2001 | Ota | ............ | 327/536 |
| 6,184,732 B1 * | 2/2001 | Johnson et al. | ............ | 327/157 |
| 6,255,873 B1 * | 7/2001 | Johnson et al. | ............ | 327/157 |
| 6,329,872 B1 | 12/2001 | Foroudi | | |
| 6,362,698 B1 * | 3/2002 | Gupta | ............ | 331/117 FE |
| 6,504,435 B1 * | 1/2003 | Martins | ............ | 330/292 |
| 6,525,613 B2 * | 2/2003 | Cyrusian | ............ | 331/17 |
| 6,590,448 B1 * | 7/2003 | Burt | ............ | 330/124 R |
| 6,617,931 B2 * | 9/2003 | Theus et al. | ............ | 330/310 |
| 6,624,405 B1 * | 9/2003 | Lau et al. | ............ | 250/214 LA |
| 6,771,114 B2 * | 8/2004 | Watarai | ............ | 327/536 |
| 6,952,126 B2 * | 10/2005 | Byun et al. | ............ | 327/157 |
| 7,015,736 B1 * | 3/2006 | Sudjian et al. | ............ | 327/157 |
| 7,088,085 B2 * | 8/2006 | Marinca | ............ | 323/314 |
| 7,102,400 B1 * | 9/2006 | Mulders | ............ | 327/157 |

(Continued)

OTHER PUBLICATIONS

Choi, et al., "Gain-Boosting Charge Pump for Current Matching in Phase-Locked Loop," IEEE Trans. On Circuits and Systems-II Express Briefs, vol. 53, No. 10, Oct. 2006, pp. 1022-1025.

(Continued)

*Primary Examiner*—Adam D Houston
(74) *Attorney, Agent, or Firm*—Gibb I.P. Law Firm, LLC; W. Riyon Harding, Esq.

(57) ABSTRACT

Disclosed are current sink and source circuits, a charge pump that incorporates them, and a phase locked loop that incorporates the charge pump. The current sink and source circuits each have a current mirror that biases a transistor connected to an output node. These circuits each further have a two-stage feedback amplifier to sense the current mirror drain voltage and to control the transistor gate voltage in order to stabilize the current mirror drain voltage independent of output voltage at the output node. The amplifier also increases output resistance at the output node. This configuration allows for a wide operation voltage range and ensures good circuit performance under a very low power supply. A charge pump that incorporates these circuits generates highly matched charging and discharging currents. A PLL that incorporates this charge pump exhibits minimal bandwidth shifts and minimal locking speed and jitter performance degradation.

35 Claims, 6 Drawing Sheets

U.S. PATENT DOCUMENTS

| | | | | |
|---|---|---|---|---|
| 7,132,885 | B2* | 11/2006 | Capofreddi et al. | 330/107 |
| 7,138,874 | B2* | 11/2006 | Theus et al. | 330/310 |
| 7,161,401 | B2* | 1/2007 | Li | 327/157 |
| 7,176,732 | B2* | 2/2007 | Innocent | 327/157 |
| 7,193,466 | B2* | 3/2007 | Kim et al. | 330/258 |
| 7,382,308 | B1* | 6/2008 | Liang et al. | 341/161 |
| 7,385,429 | B1* | 6/2008 | Mei et al. | 327/157 |
| 7,423,489 | B2* | 9/2008 | Zhan et al. | 330/294 |
| 2002/0003451 | A1* | 1/2002 | Theus et al. | 330/310 |
| 2002/0175770 | A1* | 11/2002 | Cyrusian | 331/17 |
| 2003/0210099 | A1* | 11/2003 | Ingino, Jr. | 331/57 |
| 2004/0113687 | A1* | 6/2004 | Theus et al. | 330/150 |
| 2005/0068075 | A1* | 3/2005 | Innocent | 327/157 |
| 2005/0140445 | A1* | 6/2005 | Kim et al. | 330/258 |
| 2005/0162200 | A1* | 7/2005 | Haerle | 327/157 |
| 2005/0189973 | A1* | 9/2005 | Li | 327/157 |
| 2006/0226901 | A1* | 10/2006 | Capofreddi et al. | 330/107 |
| 2007/0109031 | A1* | 5/2007 | Lin et al. | 327/157 |
| 2008/0088373 | A1* | 4/2008 | Hong et al. | 330/253 |
| 2008/0191783 | A1* | 8/2008 | Sudjian et al. | 327/536 |
| 2008/0218228 | A1* | 9/2008 | Masson | 327/157 |
| 2008/0252342 | A1* | 10/2008 | Haerle | 327/157 |
| 2008/0252377 | A1* | 10/2008 | Lee et al. | 330/279 |
| 2009/0033407 | A1* | 2/2009 | Wyatt et al. | 327/536 |

OTHER PUBLICATIONS

Lee, et al., "Charge Pump with Perfect Current Matching Characteristics in Phase-Locked Loop," Electronics Letters, vol. 36, No. 23, Nov. 2000, pp. 1907-1908.

Bahreyni, et al., "A 2.5-10-GHz Clock Multiplier Unit with 0.22ps RMS Jitter in Standard 0.18um CMOS," IEEE J. Solid State Circuits, vol. 39, No. 11, Nov. 2004, pp. 1862-1872.

Cheng, et al., "Design and Analysis of an Ultrahigh-Speed Glitch-Free Fully Differential Charge Pump with Minimum Output Current Variation and Accurate Matching," IEEE Trans. On Circuits and Systems-II Express Briefs, vol. 53, No. 9, Sep. 2006, pp. 843-847.

Terlemez, et al., "The Design of a Differential CMOS Charge Pump for High Performance Phase-Locked Loops," Proc. IEEE International Symposium on Circuit and Systems (ISCAS), 2004.

Ha, et al., "Charge-Pump Reducing Current Mismatch in DLLs and PLLs," Proc. IEEE International Symposium on Circuit and Systems (ISCAS), 2006.

* cited by examiner

Prior Art

HIGH OUTPUT RESISTANCE, WIDE SWING CHARGE PUMP

BACKGROUND

1. Field of the Invention

The embodiments of the invention generally relate to charge pumps and, more particularly, to an improved charge pump structure having high output resistance and a wide swing.

2. Description of the Related Art

The charge pump is an important circuit that is widely used in mixed signal systems. For example, in phase-locked loop circuits (PLL's), the charge pump is used to convert phase error detected by a phase/frequency detector (PFD) to analog voltage signals that are supplied to a voltage controlled oscillator. The charge pump consists of a charging current source and a discharging current sink. As a rule of thumb, it is important to ensure the current source and current sink have the same magnitude currents (e.g., in order to ensure optimal PLL performance). That is, large current mismatch between the components in the charge pump may degrade system performance, for instance, by introducing steady-state phase offset and increasing reference spurs in the PLL (See Y. S. Choi and D. H. Han, "Gain-Boosting Charge Pump for Current Matching in Phase-Locked Loop", *IEEE Trans. on Circuits and Systems-II Express Briefs*, Vol. 53, No. 10, October 2006. pp. 1022-1025; J. S. Lee and M. S. Keel, S. Lim and S. Kim, "Charge Pump with Perfect Current Matching Characteristics in Phase-Locked Loop", *Electronics Letters*, Vol. 36, No. 23, November 2000, pp. 1907-1908; B. Bahreyni and I. M. Filanovsky, "A 2.5-10-GHz Clock Multiplier Unit with 0.22 ps RMS Jitter in Standard 0.18 um CMOS", *IEEE J. Solid State Circuits*, Vol. 39, No. 11, pp. 1862-1872, November 2004; and K. S. Ha and L. S. Kim, "Charge-Pump Reducing Current Mismatch in DLLs and PLLs", *Proc. IEEE International Symposium on Circuit and Systems (ISCAS)*, 2006). Moreover, such current magnitude variation may shift PLL loop bandwidth and also degrade PLL locking speed and jitter performance.

SUMMARY

Disclosed herein are complementary current sink and current source circuits, a charge pump circuit that incorporates the current sink and current source circuits, and a phase locked loop that incorporates the charge pump circuit. The current source and current sink circuits each have a current mirror circuit that biases a transistor connected to an output node. The transistor is adapted to adjust the output voltage at the output node (i.e., the transistor is either a current sink transistor or current source transistor, depending upon the type of circuit). The current source and current sink circuits each further have a two-stage feedback amplifier (i.e., a common-gate feedback amplifier connected in series with a common-source amplifier) to sense the drain voltage of the current mirror circuit and to control the gate voltage of the transistor in order to stabilize the drain voltage of the current mirror circuit independent of variations in the output voltage at the output node. In both the current sink and current source circuits, the two-stage feedback amplifier increases the output resistance of the current mirror circuit and consequently increases the output resistance at the output node. This configuration allows for a wide operation voltage range and ensures good circuit performance under a very low power supply. Due to the increased output resistances at the output node, a charge pump circuit that incorporates the current sink and current source circuits generates highly matched charging and discharging currents. Furthermore, due to the highly matched charging and discharging currents in the charge pump circuit, a PLL circuit that incorporates the charge pump circuit exhibits minimal shifts in PLL loop bandwidth and minimal degradation of PLL locking speed and jitter performance across its full frequency range.

More particularly, disclosed herein is an embodiment of a current sink circuit that comprises a current sink device (e.g., N-type field effect transistor (N-FET)) adapted to decrease an output voltage at an output node in response to a received signal. The current sink circuit can further comprise a current mirror circuit connected to the source of the current sink device and adapted to supply a bias current (i.e., a reference current from a biasing circuit) to the current sink device. A digital switch can be connected between the current sink device and the current mirror circuit. This digital switch (e.g., an N-FET or other suitable digital switch) can be adapted to turn on in response to a signal (e.g., a "Down" signal) in order to establish a current path from the current mirror circuit through the current sink device to the output node, thereby decreasing the output voltage at the output node. An additional digital switch (e.g., an N-FET or other suitable digital switch) can be connected to the gate of the current sink device. This additional digital switch can be adapted to turn on in response to an opposite signal (e.g., a "Down_N" signal) in order to pull down the gate voltage of the current sink device and, thereby, to break the current path. Additionally, a two-stage feedback amplifier can be connected to both the current mirror circuit and the current sink device. This two-stage feedback amplifier (e.g., a common-gate feedback amplifier connected in series with a common-source amplifier) can be adapted to sense a drain voltage of the current mirror circuit and to control a gate voltage of the current sink device in order to stabilize the drain voltage of the current mirror circuit independent of variations (e.g., decreases) in the output voltage at the output node. This two-stage feedback amplifier further adds to (i.e., increases) the output resistance of the current mirror circuit and, thereby, increases the output resistance of the current sink circuit at the output node as compared to a single-stage feedback amplifier.

Similarly, disclosed is an embodiment of a complementary current source circuit that comprises a current source device (e.g., a P-type field effect transistor (P-FET)) adapted to increase an output voltage at the output node in response to a received signal. The current source circuit can further comprise a current mirror circuit connected to the source of the current source device and adapted to supply a bias current (i.e., a reference current from a biasing circuit) to the current source device. A digital switch (e.g., a P-FET or other suitable digital switch) can be connected between the current source device and the current mirror circuit. This digital switch can be adapted to turn on in response to a signal (e.g., an "Up" signal) in order to establish a current path from the current mirror circuit through the current source device to the output node, thereby increasing the output voltage at the output node. An additional digital (e.g., a P-FET or other suitable digital switch) switch can be connected to a gate of the current source device. This additional digital switch can be adapted to turn on in response to an opposite signal (e.g., an "Up_N" signal) in order to pull down the gate voltage of the current source device and, thereby, to break the current path. Additionally, a two-stage feedback amplifier can be connected to both the current mirror circuit and the current source device. This two-stage feedback amplifier (e.g., a common-gate feedback amplifier connected in series with a common-source amplifier) can be adapted to sense a drain voltage of the current mirror circuit and to control a gate voltage of the current source device in order to stabilize the drain voltage of the current mirror circuit independent of variations (e.g., increases) in the output voltage at the output node. This two-stage feedback amplifier further increases the output resistance of the current mirror circuit and, thereby, increases the output resistance of the current source circuit at the output node as compared to a single-stage feedback amplifier.

More specifically, the current sink circuit and complementary current source circuit embodiments can each comprise at least six transistors connected to a biasing circuit by at least three opposite type transistors. That is, a current sink circuit can comprise at least six N-type field effect transistors (N-FETs) connected to a biasing circuit by at least three P-type field effect transistors (P-FETs) and a current source circuit can comprise at least six P-FETs connected to a biasing circuit by at least three N-FETs.

For example, the current sink circuit and current source circuit embodiments can each comprise a first transistor, having a first source, a first gate and a first drain; a second transistor, having a second source connected to the first drain, a second gate and a second drain; a third transistor, having a third source connected to the first source, a third gate, and a third drain; a fourth transistor, having a fourth source connected to the third drain, a fourth gate and a fourth drain; a fifth transistor, having a fifth source connected to the first source and the third source, a fifth gate, and a fifth drain; and a sixth transistor, having a sixth source connected to the third drain, a sixth gate, and a sixth drain connected to an output node. The sixth transistor can be adapted to adjust the output voltage at the output node. Thus, in a current sink circuit, the sixth transistor can be the current sink device that decreases the output voltage at the output node. Contrarily, in a current source circuit, the sixth transistor can be the current source device that increases the output voltage at the output node.

Additionally, the first gate of the first transistor, the second gate of the second transistor, the third gate of the third transistor and the fourth gate of the fourth transistor can each be controlled by the second drain of the second transistor. The fifth gate of the fifth transistor can be controlled by the fourth drain of the fourth transistor and the sixth gate of the sixth transistor (i.e., the current sink or current source device, depending upon the type of circuit) can be controlled by the fifth drain of the fifth transistor. The second drain of the second transistor, the fourth drain of the fourth transistor and the fifth drain of the fifth transistor can each be connected to a biasing circuit for receiving a reference current via opposite type FETs. Finally, the aspect ratio of the first transistor is proportionally different than the aspect ratio of the other transistors in the circuit (e.g., the aspect ratio of the first transistor is half that of the second, third and fourth transistors).

Consequently, the first transistor and the third transistor in combination comprise the current mirror circuit. Additionally, the fourth transistor and the fifth transistor in combination comprise the two-stage feedback amplifier (i.e., a common gate amplifier connected in series with a common source amplifier), which can sense the drain voltage of the current mirror circuit (i.e., can sense the drain voltage at the drain of the third transistor) and can control the gate voltage of the current sink device (i.e., can control the gate voltage of the sixth transistor) so as to a stabilize the drain voltage of the current mirror circuit independent of variations in the output voltage at the output node. An overall feedback amplifier gain of the two-stage feedback amplifier will be approximately equal to the product of each gain from each stage of the two-stage feedback amplifier (i.e., equal to the common gate amplifier gain multiplied by the common source amplifier gain). By increasing the overall amplifier gain, the two-stage feedback amplifier significantly increases the current mirror circuit output resistance and, thereby, the output resistance at the output node. Additionally, the use of the common gate amplifier in the first stage of the two-stage feedback amplifier reduces the voltage requirement to the drain of the third transistor (i.e., to the output of the current mirror circuit) and thereby, increases the operation voltage range of the circuit. Finally, if the aspect ratio of the first transistor is half that of the other transistors, when the circuit conducts the current in the third transistor will be twice that in the first transistor (i.e., twice the reference current from the biasing circuit), whereas the current in the sixth transistor will be the same as that in the first transistor (i.e., the same as the reference current from the biasing circuit).

The current sink circuit and current source circuit embodiments can further comprise a capacitor (e.g., a Miller capacitor) connected between the gate and the drain of the second stage of the two-stage feedback amplifier. That is, the capacitor can be connected between the gate and drain of the fifth transistor (i.e., common source amplifier). This additional capacitor increases the feedback capacitance and, thereby, increases the circuit phase margin in order to improve circuit stability.

Finally, the current sink circuit and current source circuit embodiments can further comprise at least two digital switches. For example, one digital switch (e.g., an N-FET in a current sink circuit or a P-FET in a current source circuit) can be connected to the sixth source of the sixth transistor (i.e., connected to the source of the current sink device in a current sink circuit or connected to the source of the current source device in a current source circuit). As discussed above, this digital switch can be adapted to turn on in response to a signal in order to establish a current path from the current mirror circuit (i.e., from the third drain of the third transistor) through the current source/sink device (i.e., through the sixth transistor) to the output node. An additional digital switch (e.g., an N-FET in a current sink circuit or a P-FET in a current source circuit) can be connected to the sixth gate of the sixth transistor (i.e., to the gate of the current sink device in a current sink circuit or to the gate of the current source device in the current source circuit). As discussed above, this additional digital switch can be adapted to turn on in response to an opposite signal in order to break the current path.

Also disclosed is an embodiment of a charge pump circuit that incorporates both the current sink circuit and current source circuit embodiments, described above. Specifically, the charge pump circuit comprises a current sink circuit and a current source circuit each connected to the same output node. The current sink circuit and current source circuit are also each connected to the same biasing circuit such that they receive the same reference current. Due to the increased output resistances at the output node for both the current sink and current source circuits, this charge pump circuit generates highly matched charging and discharging currents.

Also disclosed is an embodiment of a phase locked loop (PLL) circuit that incorporates the charge pump circuit embodiment, described above. Specifically, a PLL circuit is disclosed that comprises a phase frequency detector, a charge pump, and a voltage control oscillator (VCO). As with conventional PLL circuits, this phase frequency detector can be adapted to detect a phase difference between a reference frequency and a feedback frequency that is output to the phase frequency detector from the VCO (e.g., via an optional divide-by-M device). The phase frequency detector can be adapted to generate a correction signal (i.e., either an increase signal or a decrease signal), depending upon the phase difference detected. The charge pump circuit can be connected to the phase frequency detector (e.g., via a loop filter). The charge pump circuit embodiment can be adapted to receive increase signals (e.g., "Up", "Down_N") and decrease signals (e.g., "Down", "Up_N") from the phase frequency detector. Additionally, as discussed above, the charge pump circuit can be adapted to adjust an output voltage to the VCO depending upon whether an increase signal or a decrease signal is received (see detailed discussion above regarding functions of current sink circuit and current source circuit). The VCO can be adapted to receive the adjusted voltage at the output node of the charge pump (e.g., via a loop filter) and further to adjust the output frequency based on that output voltage. Due to the highly matched charging and discharging currents in the charge pump, this PLL circuit exhibits minimal shifts in PLL loop bandwidth and minimal degradation of PLL locking speed and jitter performance across its full frequency range.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, the charge pump is an important circuit that is widely used in mixed signal systems, such as phase-locked loop (PLL) circuits. PLLs are commonly found in a large number of computer, wireless, and communications systems with many different applications (e.g., clock recovery, frequency synthesis, clock noise filtration, etc.).

A conventional phase locked loop (PLL) circuit contains a phase/frequency detector (PFD), a charge pump, a low-pass filter, a voltage controlled oscillator (VCO), and a divide-by-N counter. The PLL is a negative feed back circuit. That is, the phase/frequency detector is adapted to detect the phase/frequency difference between a reference frequency $f_{in}$ and the feedback frequency $f_{fbk}$ (e.g., the output frequency $f_{out}$ of the VCO after passing through a divide-by-N counter) and to signal to the charge pump to increase or decrease the voltage to the VCO, as necessary. For example, if $f_{in}$ is operating at a slightly faster frequency than $f_{fbk}$ 107, the PFD can output an UP signal to the charge pump. Contrarily, if $f_{in}$ is operating at a slightly slower frequency than $f_{fbk}$, the PFD can output a DOWN signal to the charge pump.

The charge pump is used to convert phase error detected by a phase/frequency detector (PFD) to analog voltage signals that are supplied to the VCO via a loop filter, which ensures that voltage to the VCO is changed gradually and prevents spiking. The charge pump typically consists of a charging current source and a discharging current sink. Generally, if an UP signal is sent to the charge pump, the current source is turned on in order to increase the voltage to the VCO. Contrarily, if a DOWN signal is sent to the charge pump, the current sink is turned on in order to decrease the voltage to the VCO. As a rule of thumb, it is important to ensure the current source and current sink have the same magnitude currents (e.g., in order to ensure optimal PLL performance). That is, large current mismatch between the components in the charge pump may degrade system performance, for instance, by introducing steady-state phase offset and increasing reference spurs in the PLL (See Y. S. Choi and D. H. Han, "Gain-Boosting Charge Pump for Current Matching in Phase-Locked Loop", *IEEE Trans. on Circuits and Systems-II Express Briefs*, Vol. 53, No. 10, October 2006. pp. 1022-1025 (hereinafter referred to as Choi); J. S. Lee and M. S. Keel, S. Lim and S. Kim, "Charge Pump with Perfect Current Matching Characteristics in Phase-Locked Loop", *Electronics Letters*, Vol. 36, No. 23, November 2000, pp. 1907-1908 (hereinafter referred to as Lee); B. Bahreyni and I. M. Filanovsky, "A 2.5-10-GHz Clock Multiplier Unit with 0.22 ps RMS Jitter in Standard 0.18 um CMOS", *IEEE J. Solid State Circuits*, Vol. 39, No. 11, pp. 1862-1872, November 2004 (hereinafter referred to as Bahreyni); and K. S. Ha and L. S. Kim, "Charge-Pump Reducing Current Mismatch in DLLs and PLLs", *Proc. IEEE International Symposium on Circuit and Systems (ISCAS)*, 2006) (hereinafter referred to as Ha)). Moreover, such current magnitude variation may shift PLL loop bandwidth and also degrade PLL locking speed and jitter performance.

To resolve the current mismatch problem, various design techniques have been proposed. For example, Choi disclosed a gain boosting charge pump to reduce the current variation.

The limitation of this method is its narrow output voltage swing, which makes it unsuitable in low power supply systems. Lee disclosed a circuit that makes certain the charging current and discharging current equal under different output voltages. However, the absolute current magnitude varies as output voltage changes. This current variation will change the PLL loop bandwidth and affect PLL performance. Fully differential charge pumps with common mode feedback (CMFB) blocks have been disclosed for current mismatch reduction (See S. F. Cheng, H. T. Tong, J. S. Martinez, A. I. Karsilayan, "Design and Analysis of an Ultrahigh-Speed Glitch-Free Fully Differential Charge Pump With Minimum Output Current Variation and Accurate Matching", *IEEE Trans. on Circuits and Systems-II Express Briefs*, Vol. 53, No. 9, September 2006, pp. 843-847 (hereinafter referred to as Cheng) and B. Terlemez and J. P. Uyemura, "The Design of a Differential CMOS Charge Pump for High Performance Phase-Locked Loops", *Proc. IEEE International Symposium on Circuit and Systems (ISCAS)*, 2004 (hereinafter referred to as Terlemez)). Nonetheless the resulting circuit structures are complex and, thus, implementation is not easy.

Figure 1:
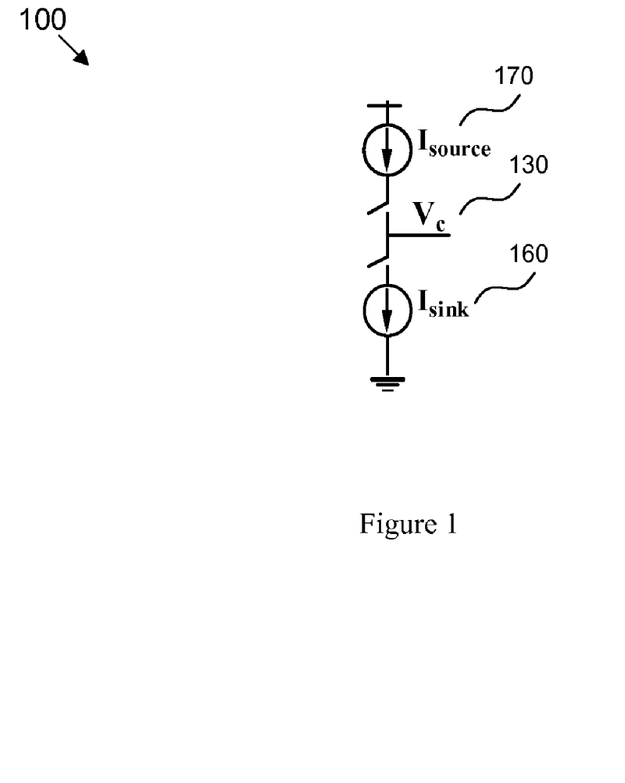
FIG. 1 is a schematic diagram illustrating a charge pump circuit.

FIG. 1 illustrates a charge pump 100 that can be incorporated into the PLL. In this charge pump 100, $I_{source}$ and $I_{sink}$ represent the current source 170 and current sink 160, respectively. Ideally, $I_{sink}$ 160 and $I_{source}$ 170 will be constantly equal and independent of the node voltage $V_c$ 130. However, in reality $I_{sink}$ 160 and $I_{source}$ 170 will vary, especially when the circuit 100 is designed in short-channel complementary metal oxide semiconductor (CMOS) processes. Specifically, current mirror circuits are typically used to implement the current source 170 and the current sink 160 circuitry in a charge pump 100. When such a charge pump 100 is designed in a long channel CMOS process, the gate-source bias voltage dominates the current mirror operation. While in a short channel CMOS process, the channel-length modulation effect must be considered. Because of the channel-length modulation, the mirror current is controlled not only by the gate-source bias voltage, but also by the drain-source voltage. Thus, the current is:

$$I_d = \frac{\mu_n C_{ox}}{2}\left(\frac{W}{L}\right)(V_{GS} - V_t)^2[1 + \lambda(V_{DS} - V_{eff})] \quad (1)$$

where λ features the channel length modulation and $V_{eff}$ is the minimum drain-source voltage (overdrive voltage) when the transistor is in the saturation region.

Figure 2:
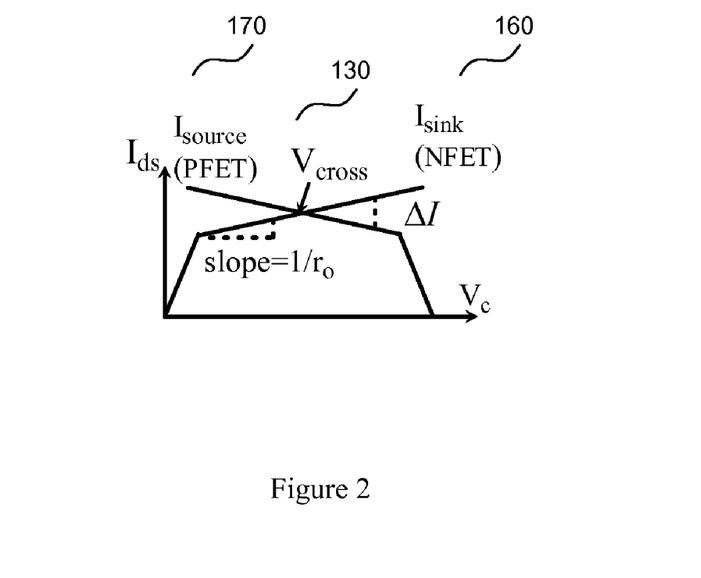
FIG. 2 is a graph illustrating sink and source currents in the charge pump circuit of FIG. 1.

FIG. 2 characterizes the charge pump 100 currents. As shown, due to the channel length modulation, $I_{source}$ 170 and $I_{sink}$ 160 are not constant. Instead, they change under different drain-source voltages. $I_{source}$ 170 and $I_{sink}$ 160 are equal only at the crossover point $V_{cross}$ 130. Under other voltages, current deviation ΔI exists. The slope of the current curve is $1/r_o$, where $r_o$ is the current mirror output resistance. If the charge pump 100 is not designed properly, a large current mismatch will exist between $I_{sink}$ 160 and $I_{source}$ 170, which may degrade the system performance (See Lee).

In view of the foregoing, disclosed herein are complementary current sink and current source circuits, a charge pump circuit that incorporates the current sink and current source circuits, and a phase locked loop circuit that incorporates the charge pump circuit. The current source and current sink circuits each have a current mirror circuit that biases a transistor connected to an output node. The transistor is adapted to adjust the output voltage at the output node (i.e., the transistor is either a current sink transistor or current source transistor, depending upon the type of circuit). The current sink and current source circuits each further have a two-stage feedback amplifier, including a common-gate feedback amplifier connected in series with a common-source amplifier. This two-stage feedback amplifier is adapted to sense the drain voltage of the current mirror circuit and to control the gate voltage of the transistor in order to stabilize the drain voltage of the current mirror circuit independent of variations in the output voltage at the output node. In both the current sink and current source circuits, the two-stage feedback amplifier increases the output resistance of the current mirror circuit and consequently increases the output resistance at the output node. This configuration allows for a wide operation voltage range and ensures good circuit performance under a very low power supply. Due to the increased output resistances at the output node, a charge pump circuit that incorporates the current sink and current source circuits generates highly matched charging and discharging currents. Furthermore, due to the highly matched charging and discharging currents in the charge pump circuit, a PLL circuit that incorporates the charge pump circuit exhibits minimal shifts in PLL loop bandwidth and minimal degradation of PLL locking speed and jitter performance across its full frequency range.

Figure 3:
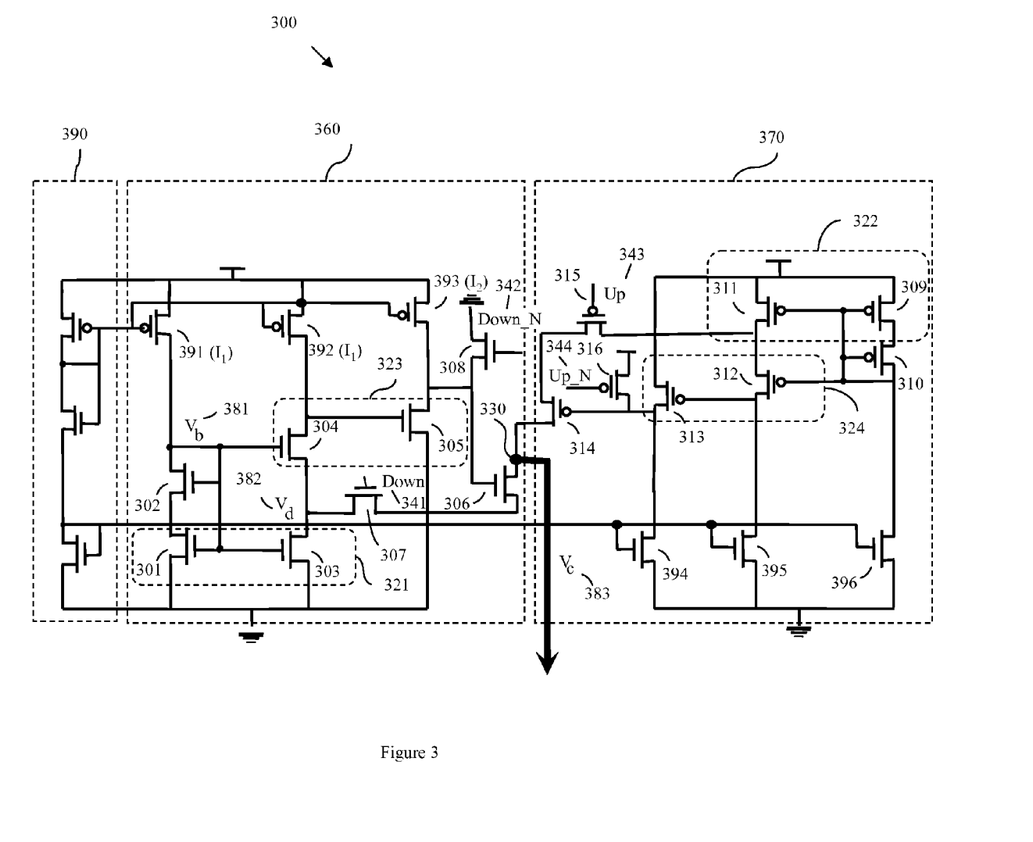
FIG. 3 is a schematic diagram illustrating an embodiment of the current sink circuit of the present invention and an embodiment of the current source circuit of the present invention incorporated into an embodiment of the charge pump circuit of the present invention.

More particularly, referring to FIG. 3, disclosed herein is an embodiment of a current sink circuit 360 that comprises a current sink device 306 (e.g., N-type field effect transistor (N-FET)) adapted to decrease an output voltage at an output node 330 in response to a received signal. The current sink circuit 360 can further comprise a current mirror circuit 321 (see current mirror transistors 301/303) connected to the source of the current sink device 306 and adapted to supply a bias current (i.e., a reference current from a biasing circuit 390) to the current sink device 306. A digital switch 307 (e.g., an N-FET or other suitable digital switch) can be connected between the current mirror circuit 321 and the current sink device 306 and, more particularly, connected between the source of the current sink device 306 and the drain of current mirror transistor 303. This digital switch can be adapted to turn on in response to a signal (e.g., a "Down" signal 341) in order to establish a current path from the current mirror circuit 321 through the current sink device 306 to the output node 330, thereby decreasing the output voltage at the output node 330. An additional digital switch 308 (e.g., an N-FET or other suitable digital switch) can be connected to the gate of the current sink device 306. This additional digital switch 308 can be adapted to turn on in response to an opposite signal (e.g., a "Down_N" signal 342) in order to pull down the gate voltage of the current sink device 306 and, thereby, to break the current path. Additionally, a two-stage feedback amplifier 323 (see feedback amplifier transistors 304/305) can be connected to both the current mirror circuit 321 (at the drain of current mirror transistor 303) and the current sink device (at the gate of the transistor 306). Specifically, this two-stage feedback amplifier 323 can be adapted to sense the drain voltage of the current mirror transistor 303 in the current mirror circuit 321 and to control a gate voltage of the current sink device 306 in order to stabilize the drain voltage of current mirror transistor 303 independent of variations (e.g., decreases) in the output voltage at the output node 330. This two-stage feedback amplifier 323 further increases the output resistance of the current mirror circuit 321 and, thereby, increases the output resistance of the current sink circuit 360 at the output node 330 relative to prior art current sink circuits which use a single-stage feedback amplifier.

Similarly, disclosed is an embodiment of a complementary current source circuit 370 that comprises a current source device 314 (e.g., a P-type field effect transistor (P-FET))

adapted to increase an output voltage at the output node 330 in response to a received signal. The current source circuit 370 can further comprise a current mirror circuit 322 (see current mirror transistors 309/311) connected to the source of the current source device 314 and adapted to supply a bias current (i.e., a reference current from a biasing circuit) to the current source device 314. A digital switch 315 (e.g., a P-FET or other suitable digital switch) can be connected between the current mirror circuit 322 and the current source device 314 and, more particularly, connected between the source of the current source device 314 and the drain of the current mirror transistor 311 in the current mirror circuit 322. This digital switch 315 can be adapted to turn on in response to a signal (e.g., an "Up" signal 343) in order to establish a current path from the current mirror circuit 322 through the current source device 314 to the output node 330, thereby increasing the output voltage at the output node 330. An additional digital switch 316 (e.g., a P-FET or other suitable digital switch) can be connected to a gate of the current source device 314. This additional digital switch 316 can adapted to turn on in response to an opposite signal (e.g., an "Up_N" signal 344) in order to pull down the gate voltage of the current source device 314 and, thereby, to break the current path. Additionally, a two-stage feedback amplifier 324 (see feedback amplifier transistors 312/313) can be connected to both the current mirror circuit 322 (at the drain of current mirror transistor 311) and the current source device 314 (at the gate of transistor 314). Specifically, this two-stage feedback amplifier 324 can be adapted to sense a drain voltage of the current mirror transistor 311 and to control a gate voltage of the current source device 314 in order to stabilize the drain voltage of the current mirror transistor 311 in the current mirror circuit 322 independent of variations (e.g., increases) in the output voltage at the output node 330. This two-stage feedback amplifier 324 further increases the output resistance of the current mirror circuit 322 and, thereby, increases the output resistance of the current source circuit 370 at the output node 330 relative to prior art current source circuits which use a single-stage feedback amplifier.

The current sink circuit 360 and complementary current source circuit 370 embodiments can each comprise at least six transistors connected to a biasing circuit by at least three opposite type transistors. That is, the current sink circuit 360 can comprise at least six N-type field effect transistors (N-FETs) 301-306 connected to a biasing circuit 390 by at least three P-type field effect transistors (P-FETs) 391-393. The current source circuit 370 can comprise at least six P-FETs 309-314 connected to a biasing circuit 390 by at least three N-FETs 394-396.

For example, the current sink circuit 360 and current source circuit 370 embodiments can each comprise a first transistor (see N-FET 301 of current sink circuit 360 or see P-FET 309 of current source circuit 370), having a first source, a first gate and a first drain; a second transistor (see N-FET 302 of current sink circuit 360 or see P-FET 310 of current source circuit 370), having a second gate, a second drain and second source connected to the first drain; a third transistor (see N-FET 303 of current sink circuit 360 or see P-FET 311 of current source circuit 320), having a third gate, a third drain, and a third source connected to the first source; a fourth transistor (see N-FET 304 of current sink circuit 360 or see P-FET 312 of current source circuit 320), having a fourth gate, a fourth drain and a fourth source connected to the third drain; a fifth transistor (see N-FET 305 of current sink circuit 360 or see P-FET 313 of current source circuit 370), having a fifth gate, a fifth drain and a fifth source connected to the first source and the third source; and a sixth transistor (see N-FET 306 of current sink circuit 360 or P-FET 314 of current source circuit 370), having a sixth gate, a sixth drain, and a sixth source connected to the third drain. The sixth drain of the sixth transistor (306, 314) can be connected to the output node 330 and the sixth transistor (306, 314) can be adapted to adjust the output voltage at the output node 330. Thus, in the current sink circuit 360, the sixth transistor 306 can be the current sink device that decreases the output voltage at the output node 330. Contrarily, in the current source circuit 370, the sixth transistor 314 can be the current source device that increases the output voltage at the output node 330.

Additionally, the first gate of the first transistor (301, 309), the second gate of the second transistor (302, 310), the third gate of the third transistor (303, 311) and the fourth gate of the fourth transistor (304, 312) can each be controlled by the second drain of the second transistor (302, 310). The fifth gate of the fifth transistor (305, 313) can be controlled by the fourth drain of the fourth transistor (304, 312) and the sixth gate of the sixth transistor (306, 314) (i.e., the current sink or current source device, depending upon the type of circuit) can be controlled by the fifth drain of the fifth transistor (305, 313). The second drain of the second transistor (302, 310), the fourth drain of the fourth transistor (304, 312) and the fifth drain of the fifth transistor (305, 313) can each be connected to a biasing circuit 390 for receiving a reference current via opposite type FETs (see P-FETs 391-393 of current sink circuit 360 or N-FETs 394-396 of current source circuit 370). Finally, the aspect ratio of the first transistor (301, 309) is proportionally different than the aspect ratio of the other transistors in the circuit (e.g., the aspect ratio of the first transistor is half that of the second, third and fourth transistors).

Consequently, the first transistor (301, 309) and the third transistor (303, 311) in combination comprise the current mirror transistors in the current mirror circuit (321, 322). Additionally, the fourth transistor (304, 312) and the fifth transistor (305, 313) in combination comprise the feedback amplifier transistors in the two-stage feedback amplifier (323, 324). Specifically, the fourth transistor (304, 312) comprises a common gate amplifier and is connected in series with the fifth transistor (305, 313), which comprises a common source amplifier. In this configuration, the two-stage feedback amplifier (323, 324) can sense the drain voltage of third transistor (303, 311) in the current mirror circuit (321, 322) and can control the gate voltage of the current sink device (306, 314) (i.e., can control the gate voltage of the sixth transistor) so as to a stabilize the drain voltage of the third transistor (303, 311) independent of variations in the output voltage at the output node 330. An overall feedback amplifier gain of the two-stage feedback amplifier (323, 324) will be approximately equal to the product of each gain from each stage of the two-stage feedback amplifier (i.e., equal to the common gate amplifier gain multiplied by the common source amplifier gain). By increasing the overall amplifier gain, the two-stage feedback amplifier (323, 324) significantly increases the current mirror output resistance and, thereby, increases the output resistance of the circuit (360, 370) at the output node 330. Additionally, the use of the common gate amplifier (304, 312) in the first stage of the two-stage feedback amplifier reduces the voltage requirement to the drain of the current mirror device and thereby, increases the operation voltage range of the circuit. Finally, if the aspect ratio of the first transistor (301, 309) is half that of the other transistors, when the circuit conducts the current in the third transistor (303, 311) will be twice that in the first transistor (i.e., twice the reference current from the biasing circuit), whereas the current in the sixth transistor (306, 314) will be the same as that in the first transistor (i.e., the same as the reference current from the biasing circuit).

Figure 8:
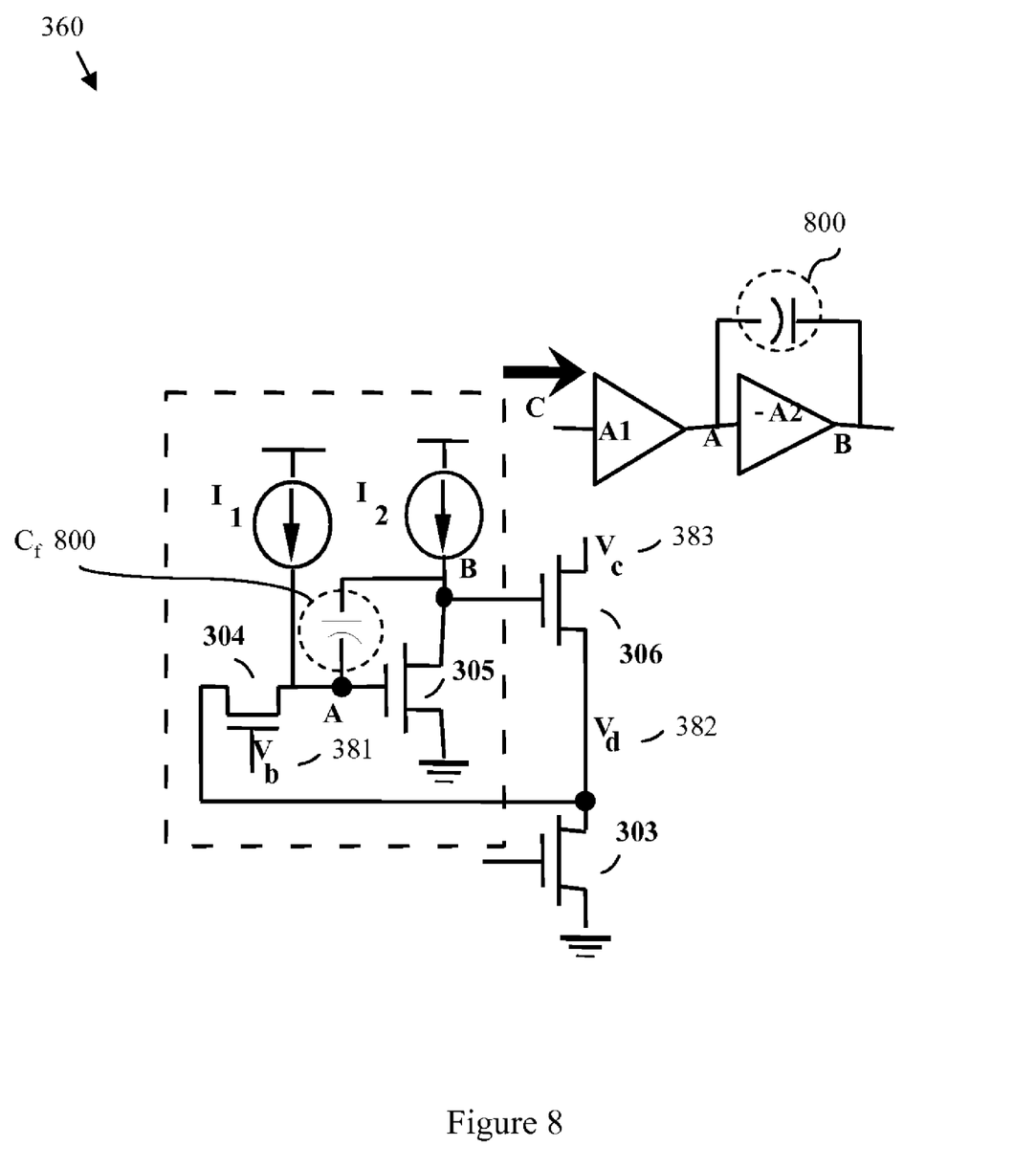
FIG. 8 is a schematic diagram illustrating the current sink circuit of FIG. 3 with added capacitance.

The current sink circuit and current source circuit embodiments can further comprise a capacitor (e.g., a Miller capacitor) connected between the gate and the drain of the second stage of the two-stage feedback amplifier (see FIG. 8 and detailed discussion below). That is, the capacitor can be connected between the gate and drain of the fifth transistor (i.e., common source amplifier). This additional capacitor increases the feedback capacitance and, thereby, increases the circuit phase margin in order to improve circuit stability.

Finally, the current sink circuit 360 and current source circuit 370 embodiments can further comprise at least two digital switches. For example, one digital switch (e.g., an N-FET 307 in a current sink circuit 360 or a P-FET 315 in a current source circuit 370) can be connected to the sixth source of the sixth transistor (306, 314) (i.e., connected to the source of the current sink device in a current sink circuit or connected to the source of the current source device in a current source circuit). As discussed above, this digital switch (307, 315) can be adapted to turn on in response to a signal in order to establish a current path from the current mirror circuit (321, 322) (i.e., from the third drain of the third transistor (303, 311)) through the current source/sink device (i.e., through the sixth transistor (306, 314)) to the output node 330. An additional digital switch (e.g., an N-FET 308 in a current sink circuit 360 or a P-FET 316 in a current source circuit 370) can be connected to the sixth gate of the sixth transistor (306, 314) (i.e., to the gate of the current sink device in a current sink circuit or to the gate of the current source device in the current source circuit). As discussed above, this additional digital switch (308, 316) can be adapted to turn on in response to an opposite signal in order to break the current path.

Those skilled in the art will recognize that current variation of a CMOS current mirror is inversely proportional to output resistance. That is, as the output resistance of a current mirror is increased, current variation between the reference current and the current mirror is decreased and vice versa. Therefore, since the current source and current sink circuits in a conventional charge pump are current mirrors for the biasing current, large approximately equal output resistances in those circuits can be used to reduce the charge pump's current sensitivity to the drain-source bias voltage variation and, thereby, can be used to ensure good current matching between the charging current and discharging current in a charge pump. Thus, disclosed herein is a charge pump 300 of FIG. 3 that incorporates the current sink circuit 360 and current source circuit 370, discussed above, which exhibit high output resistances, in order to achieve highly matched charging and discharging currents. Also disclosed is a PLL circuit 400 that incorporates the charge pump 300 that exhibits high output resistance in order to minimize shifts in PLL loop bandwidth and degradation of PLL locking speed and jitter performance across its full frequency range.

Specifically, referring again to FIG. 3, also disclosed is an embodiment of a charge pump circuit 300 that incorporates both the current sink circuit 360 and current source circuit 370 embodiments, described above. In such a charge pump circuit 300, the current sink circuit 360 is connected to an output node 330 and a biasing circuit 390 (e.g., via transistors 391-393). The current sink circuit 360 comprises a current mirror circuit 321 and a current sink device 306. The current mirror circuit 321 is adapted to mirror the reference current of the biasing circuit 390 and to then bias the current sink device 306. The current sink device 306 is adapted to decrease the output voltage at the output node. To accomplish this, the current sink circuit 360 comprises a plurality of N-type field effect transistors (N-FETs) 301-306 and digital switches 307-308 (e.g., N-FETs or some other suitable digital switches).

Figure 4:
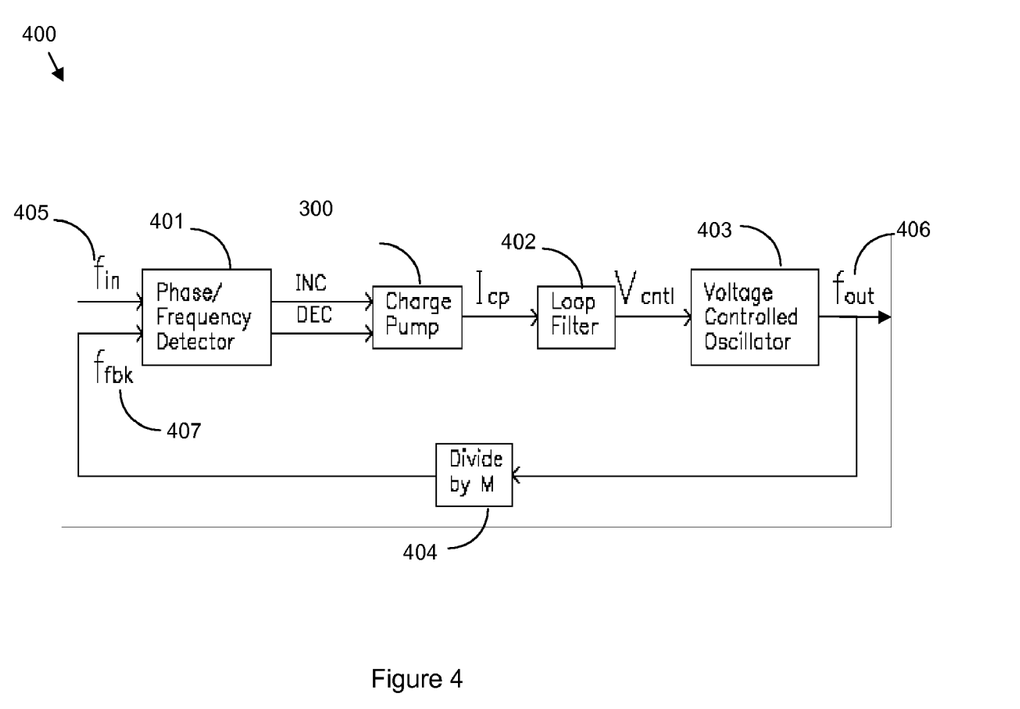
FIG. 4 is a schematic diagram illustrating an embodiment of a phase locked loop (PLL) circuit of the present invention incorporating the charge pump of FIG. 3.

Digital switch 307 can be controlled by a "Down" signal that is input to the charge pump 300 (e.g., from a phase/frequency detector (PFD) 401 in a PLL circuit 400 of FIG. 4). Specifically, when a "Down" signal is high, the switch 307 will turn on. This will conduct sink current (i.e., discharging current) through transistor 306. The voltage source $V_c$ 383 is used to emulate the charge pump output node 330 voltage and in a PLL circuit 400, the $V_c$ is used to emulate the VCO's control voltage.

Transistor 302 is stacked over transistor 301 and its drain and gate nodes are connected together with the gate of transistor 301. Transistors 302, 303 and 304 each have the same aspect ratio, which is two times that of 301 (i.e., the aspect ratio of 301 is half that of 302, 303 and 304). Additionally, current mirror circuit 321 is formed form the current mirror transistors 301 and 303. This configuration ensures that current mirror transistor 301 stays in the saturation region with a very low overdrive voltage, which correspondingly reduces the current mirror transistor 303 drain voltage requirement. As a result, the current sink circuit 360 can operate under a low power supply (i.e., at very low voltages).

The drain of current mirror transistor 303 connects to the source of current sink transistor 306 as well as to the source of transistor 304 (i.e., to the two-stage feedback amplifier 323). Digital switch 307 can be incorporated into the current sink circuit 360 structure between the drain of current mirror transistor 303 and the source of current sink transistor 306 (as illustrated in current sink circuit 360 of FIG. 3). Since the aspect ratio of transistor 303 is two times that of transistor 301, if transistor 301 current is $I_1$, the current in transistor 303 is thus $2*I_1$ when the current sink conducts (i.e., when transistors 307 and 306 turn on). Furthermore, the transistor 303 current equals the sum of the transistor 304 current and the transistor 306 current. Since the drain of transistor 304 connects to the current source $I_1$, when the current sink is on (i.e., when the "DOWN" signal is high), the current in transistor 306 will be $2I_1-I_1=I_1$. This current is the charge pump sink current.

Digital switch 308 can also be controlled by the signal that is input to the charge pump 300 (e.g., from a phase/frequency detector (PFD) 401 of a phase locked loop (PLL) circuit 400 of FIG. 4). This switch 308 can be used to accelerate the current sink cut-off speed. Specifically, switch 308 can connect to the gate of transistor 306. The control signal for 308 can be a "Down_N", which is the inverted "Down" signal that controls switch 307. That is, digital switches 307 and 308 can be toggled together by the complementary "Down" and "Down_N" signals. When "Down_N" is low (i.e., when "Down" signal is high), switch 307 turns on, switch 308 turns off and the current sink is conducted. Oppositely, when "Down_N" signal is high (i.e., when "Down" signal is low), switch 307 will turn off and switch 308 will turn on. Turning switch 307 off and switch 308 on pulls down the gate of transistor 306 to GND and, thereby, shuts off the charge pump discharging current. When the discharging current path is off, current mirror transistor 303 is forced into the linear region and its current is $I_1$.

As mentioned above, the charge pump circuit 300 relies on a large output resistances from the current mirror circuit 321 of the current sink circuit 360 and from the current mirror circuit 322 of the current source circuit 370 (as current mirrors of the same reference current from biasing circuit 390) to ensure current matching between the charging current of the current source circuit 370 and discharging current of the current sink circuit 360. In the current sink circuit 360 a large output resistance at Vc 383 is achieved through the use of a multi-stage feedback amplifier 323. Specifically, in the current sink circuit 360, the source of transistor 304 can be connected to the drain of the current mirror circuit 321 (i.e., the drain of transistor 303), the drain of transistor 304 can be connected to the gate of transistor 305 and the drain of transistor 305 can be connected to the gate of the current sink device (i.e., transistor 306). Transistor 304 is, thus, configured as a common gate amplifier. That is, the gate of transistor 304 is tied to the non-varying drain voltage of transistor 302 ($V_b$ 381) and not to either the drain voltage of transistor 306 ($V_c$ 383) or the drain voltage of transistor 303 ($V_d$ 382). Transistor 305 is, thus, configured as a common source amplifier. That is, the source of transistor 305 is tied to ground and not to either the $V_c$ 383 or $V_d$ 382. These two amplifiers, 304 and 305, function as a two-stage feedback amplifier 323 to regulate the drain voltage of the current mirror circuit 321 and, particularly, of transistor 303 ($V_d$ 382) so that it is stable irrespective of variations in the drain voltage of the current sink device 306 ($V_c$ 383) (i.e. irrespective of the output voltage at the output node 330).

Consequently, if the drain voltage of transistor 303 ($V_d$ 382) is affected by the drain voltage of transistor 306 ($V_c$ 383) so that it increases, the negative gain of the two-stage feedback amplifier 323 will reduce the gate voltage of transistor 306 in order to simultaneously force down the drain voltage of transistor 303 ($V_d$ 382). Contrarily, when the drain voltage of transistor 303 ($V_d$ 382) is affected by the drain voltage of transistor 306 ($V_c$ 383) so that it decreases, the negative gain of the two-stage feedback amplifier 323 will increase the gate voltage to transistor 306 in order to simultaneously pull up the drain voltage of transistor 303 ($V_d$ 382). The stable drain voltage of transistor 303 ($V_d$ 382) will maintain a steady current in transistors 303 and 306 when the current sink is on (i.e., when switch 307 is on). As discussed above, when the "Down-N" signal is high cutting off the feedback path, there will be no discharging current flowing through transistor 306.

One benefit of this two-stage feedback amplifier 323 (i.e., connected amplifiers 304 and 305) in the current sink circuit 360 is that it allows the overall feedback amplifier gain in the current sink circuit 360 to be large (i.e., approximately equal to the product of the gains of the two distinct amplifiers, 304 and 305). Such a large feedback amplifier gain allows the output resistance of the current mirror circuit 321 (i.e., transistor pair 301 and 303) in the current sink circuit 360 to be significantly increased, thereby minimizing current variations between current mirror circuit 321 and the biasing circuit 390, and more importantly, increasing the output resistance of current sink circuit 360 at the output 330.

Figure 5:
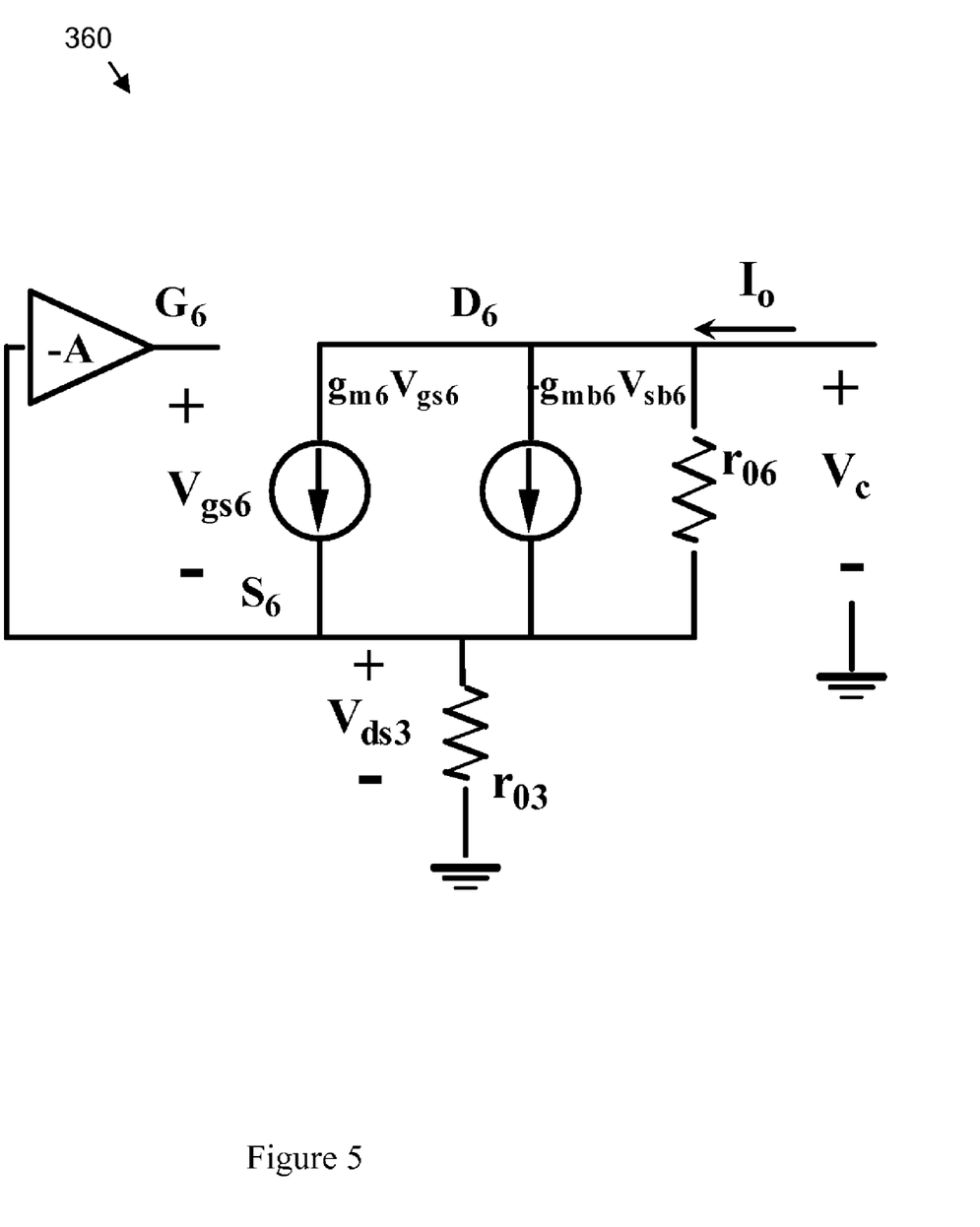
FIG. 5 is a schematic diagram illustrating a small signal model of the current sink circuit of FIG. 3.

For example, FIG. 5 illustrates a small signal model of the current sink circuit 360, where $g_{m6}$ and $g_{mb6}$ are transistor 306's transconductance and body-effect transconductance, respectively, and where $r_{o6}$ and $r_{o3}$ represent transistor 306's and transistor 303's output resistances, respectively. If the overall gain of two series connected amplifiers is −A, then transistor 306's gate-source bias voltage is as follows:

$$V_{gs6} = -AV_{s6} - V_{s6} = -(A+1)V_{s6} = -(A+1)V_{ds3} \tag{2}$$

Applying KCL at node D6, the following is obtained:

$$I_o + g_{m6}(A+1)V_{ds3} + g_{mb6}V_{ds3} - (V_c - V_{ds3})/r_{o6} = 0 \tag{3}$$

where $$V_{ds3} = I_o * r_{o3} \tag{4}$$

Substituting Eq. 2 and Eq. 3 into Eq. 4, the following is obtained:

$$I_o(1 + g_{m6}(A+1)r_{o3} + g_{mb6}r_{o3} + r_{o3}/r_{o6}) = V_C/r_{o6} \tag{5}$$

The current sink 360 output resistance can then be calculated as follows:

$$r_o = V_c/I_o = r_{o3} + r_{o6} + (g_{m6}(A+1) + g_{mb6})r_{o3}r_{o6} \tag{6}$$

Figure 6:
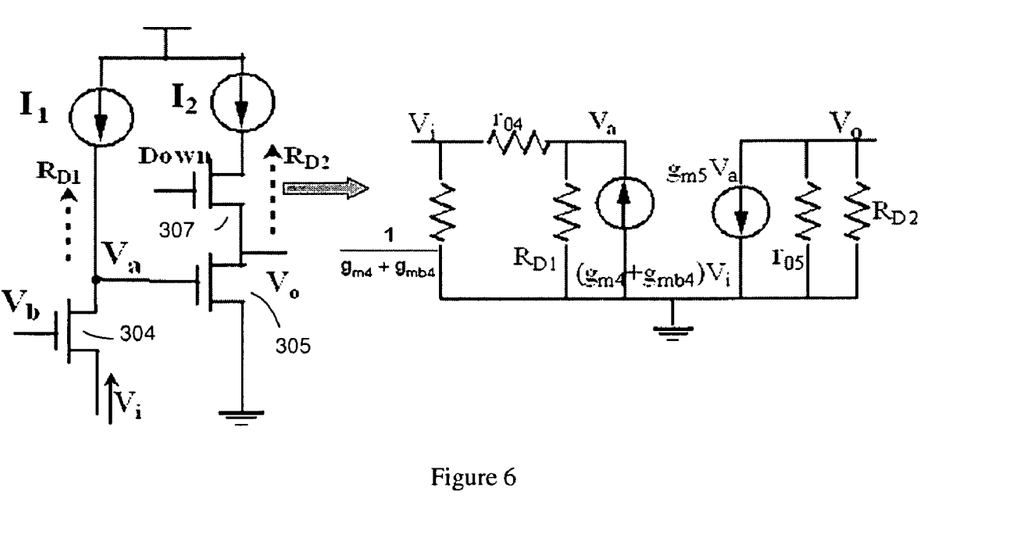
FIG. 6 is a schematic diagram illustrating a small signal model of a common gate amplifier and common source amplifier in a two-stage feedback amplifier in the current sink circuit of FIG. 3.

In Eq. 6, the amplifier gain A is the only unknown parameter. To calculate A, a new small signal model is developed. For example, FIG. 6 illustrates a small signal model of the common gate amplifier 304 and the common source amplifier 305. In FIG. 6, it is assumed that the resistance of current source $I_1$ is $R_{D1}$, and the resistance of current source $I_2$ is $R_{D2}$. By applying KCL at node $V_a$, the following is obtained:

$$\frac{V_a - V_i}{r_{o4}} + \frac{V_a}{R_{D1}} - (g_{m4} + g_{mb4})V_i = 0 \tag{7}$$

At the output node $V_c$, $$g_{m5}V_a + \frac{V_c}{r_{o5}} + \frac{V_c}{R_{D2}} = 0 \tag{8}$$

Thus, $\frac{V_c}{V_a} = -g_{m5}(r_{o5}//R_{D2})$ (9)

Substituting Eq. 9 into Eq. 7 and rearranging the resulted equation, the following is obtained:

$$\frac{V_a}{V_i} = \frac{1/r_{o4} + g_{m4} + g_{mb4}}{1/r_{o4} + 1/R_{D1}} \tag{10}$$

If $R_{D1} \gg r_{o4}$, then Eq. 10 is approximated as follows:

$$\frac{V_a}{V_i} \approx \frac{1/r_{o4} + g_{m4} + g_{mb4}}{1/r_{o4}} = 1 + (g_{m4} + g_{mb4})r_{o4} \tag{11}$$

The amplifier gain is as follows:

$$\frac{V_c}{V_i} = \frac{V_c}{V_a}\frac{V_a}{V_i} = -g_{m5}(r_{o5}//R_{D2})(1 + (g_{m4} + g_{mb4})r_{o4}) \tag{12}$$

Since $R_{D2}$ is usually much larger than $r_{o5}$, the gain amplitude can be approximated as follows:

$$A = |V_c/V_i| \approx g_{m5}r_{o5}(1 + (g_{m4} + g_{mb4})r_{o4}) \tag{13}$$

Plugging Eq. 15 into Eq. 8, the current sink 360 output resistance $r_o$ can be calculated as follows:

$$r_o = r_{o3} + r_{o6} + (g_{m6}(g_{m5}r_{o5}(1 + (g_{m4} + g_{mb4})r_{o4}) + 1) + g_{mb6})r_{o3}r_{o6} \tag{14}$$

Since $A \gg 1$, $g_{m6}(1+A) \gg g_{mb6}$ and $g_{m4} \gg g_{mb4}$, the following can be approximated:

$$r_o \approx g_{m6}r_{o6}g_{m5}r_{o5}g_{m4}r_{o4}r_{o3} \tag{15}$$

Therefore, solving for $r_0$ in Eq. 15 illustrates that the current sink 360 incorporated into the charge pump 300 of the present invention increases the current sink output resistance significantly over that found in prior art currents sinks having a single common source amplifier.

Figure 7:
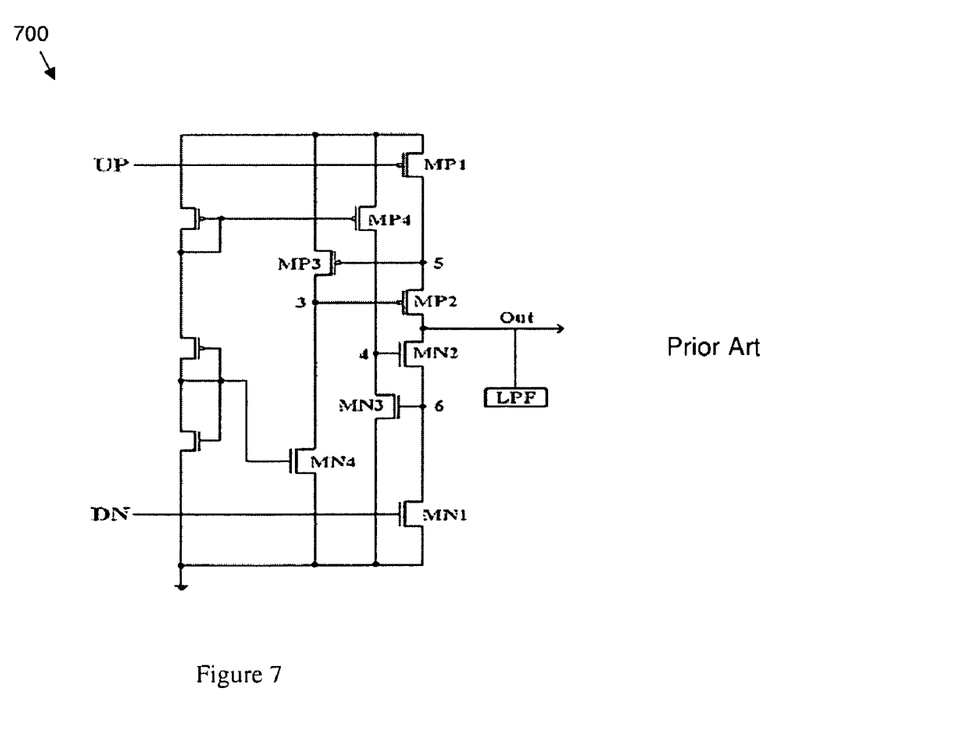
FIG. 7 is a schematic diagram illustrating an exemplary prior art charge pump.

Another benefit of the two-stage feedback amplifier 323 in the current sink circuit 360 is that it guarantees a very wide operation voltage range. For example, FIG. 7 illustrates an exemplary prior art charge pump 700, as disclosed in Choi, the current sink in this charge pump 700 consists of transistors MN1, MN2 and MN3. The transistor MN3 is configured as a feedback common source amplifier for voltage regulation of node 6. In this configuration, when the current sink turns on, transistor MN2 and MN3 are in saturation regions. The minimum output voltage $V_{out}$ to operate MN2 and MN3 can be obtained as follows:

$$V_{out}=V_{ds2}+V_{gs3} \quad (16)$$

$V_{ds2}$ is the drain-source voltage of 302 and $V_{gs3}$ is the gate-source bias of 303. If the overdrive voltages of 302 and 303 (i.e., $V_{ov2}$ and $V_{ov3}$, respectively) are equal, then the output voltage can be determined as follows:

$$V_{out}=V_{ov2}+V_t+V_{ov3} \text{ or } V_{out}=2V_{ov}+V_t \quad (17)$$

This is the minimum node voltage for current sink operation in current sink 700 of FIG. 7.

Contrarily, for the current sink 360 of FIG. 3, the minimum required $V_{out}$ is $$V_{out}=V_{ds6}+V_{ds3} \quad (18)$$

If 303 and 306 overdrive voltages are both $V_{ov}$, then $$V_{out}=V_{ov6}+V_{ov3}=2V_{ov} \quad (19)$$

Consequently, by comparing Eq. 17 and Eq. 19, it is clear that the obligatory $V_{out}$ in the current sink 360 of FIG. 3 eliminates the threshold voltage term $V_t$. Since the overdrive voltage can be implemented much smaller than the threshold voltage, the current sink 360 can operate normally even when $V_{out}$ is very low. In other words, the current sink circuit 360 improves the output voltage swing, while at the same time increases the output resistance.

It should be noted that due to the existence of the strong feedback path through the two-stage feedback amplifier 323, the locations of circuit poles in the current sink circuit 360 of FIG. 3 can be manipulated, as necessary. For example, FIG. 8 represents an alternative current sink circuit 360 that can be incorporated into the charge pump 300 of FIG. 3. For ease of illustration, the digital switches 307 and 308 as well as transistors 301-303 have been temporarily removed. Specifically, FIG. 8 illustrates that the current sink circuit 360 can comprise three nodes along the signal path (namely, nodes A, B and C). Each of these nodes introduces one pole. Hence, the current sink circuit 360 is a 3-pole system. Among these three nodes, A and B are high resistance nodes and C is a much lower resistance node than when compared to A and B.

Specifically, the resistance of node C ($R_c$) can be determined as follows:

$$R_c=(1/g_{m4})//(1/g_{m6})//r_{ds3} \quad (20)$$

Since $r_{ds3} >> 1/g_{m4}$ and $r_{ds3} >> 1/g_{m6}$, the resistance of node C ($R_c$) can further be approximated as follows:

$$R_c \approx (1/g_{m4})//(1/g_{m6})=1/(g_{m4}+g_{m6}) \quad (21)$$

The resistance of node A ($R_a$) can be determined as follows:

$$R_a=[(1+(g_{m4}+g_{mb4})r_{ds3})R_c+r_{ds3}]//R_{D1} \quad (22)$$

Finally, the resistance of node B ($R_b$), can be determined as follows:

$$R_b=r_{ds5}//R_{D2} \quad (23)$$

In above equations, $R_{D1}$ and $R_{D2}$ are the resistances of current sources $I_1$ and $I_2$. Furthermore, the poles associated with nodes A, B and C are as follows:

$$p_a=1/(R_a*C_a), p_b=1/(R_b*C_b) \text{ and } p_c=1/(R_c*C_c) \quad (24)$$

where $C_a$, $C_b$ and $C_c$ are the parasitic capacitances of nodes A, B and C, respectively. As mentioned above, the node C resistance ($R_c$) is much lower than the node A and B resistances (i.e., $R_a$ and $R_b$, respectively), the pole of C ($p_c$) is a high frequency pole that is away from the origin, while the poles of A and B (i.e., $p_a$ and $p_b$, respectively) are two dominant low frequency poles.

Consequently, in order to accomplish the desired circuit stability with enough phase margin, $p_a$ and $p_b$ need to be separated from each other. For example, one technique for effectively separating $p_a$ and $p_b$ can comprise manipulating the sizes of the transistors in the loop path in order to magnify the resistance difference between $R_a$, and $R_b$. However, the effectiveness of this technique is limited because the large transistor size adjustment may shift the circuit operating point and deteriorate the circuit specification.

Another technique for effectively separating $p_a$ and $p_b$ can comprise incorporating a capacitor into the current sink circuit. For example, referring to FIG. 8, a Miller capacitor 800 can be connected to the current sink circuit 360 between nodes A and B and employed to configure the pole $p_a$ as the dominant pole and $p_b$ as the first non-dominant pole. Specifically, the capacitor $C_f$ 800 can be added between the drain and gate of transistor 305 (i.e., between the drain and gate of the second stage of the two-stage feedback amplifier). According to Eq. 9, the gain of this second stage is $A_2=g_{m5}(r_{o5}//R_{D2})$ and $A_2 >> 1$. Thus the equivalent feedback capacitance at node A is increased to $(1+A_2)*C_f$, and the new pole $p_a$ is obtained as follows:

$$p_a=1/[R_a*(C_a+(1+A2)*C_f)] \quad (25)$$

This equation indicates that pole $p_a$ is moved to a much lower frequency that is away from pole $p_b$. Above all, by using the Miller capacitor 800 to separate the dominant pole from the first non-dominant pole, the circuit phase margin will be increased, and the circuit stability is improved.

Referring again to FIG. 3 and as discussed above, in addition to comprising a current sink circuit 360, the charge pump 300 also comprises a current source circuit 370. This current source circuit 370 is electrically connected to the same voltage output node 330 and the same biasing circuit 390 (e.g., via transistors 394-396) as the current sink circuit 360. The current source circuit 370 comprises a current mirror circuit 322 and a current source device 314. The current mirror circuit 322 is similarly adapted to mirror the reference current of the biasing circuit 390 such that the current source circuit 370 and current sink circuit 360 each have the same current magnitude. The current source device 314 is adapted to increase the output voltage at the output node 330. To accomplish this, the current source circuit 360 can comprise a plurality of field effect transistors 311-314 having an opposite type conductivity as that of transistors 301-306 of the current sink circuit 360 (i.e., P-type field effect transistors (P-FETs)) and a digital switches 315-316 (e.g., P-FETs or some other suitable digital switch).

Digital switch 315 can be controlled by an "Up" signal that is input to the charge pump 300 (e.g., from a phase/frequency detector (PFD) of a phase locked loop (PLL) circuit 400 of FIG. 4). Specifically, when an "Up" signal is high, 315 can turn on. This will conduct source current (i.e., charging current) in transistor 314.

Transistor 310 is stacked over transistor 309 and its drain and gate nodes are connected together with the gate of transistor 312. Transistors 310, 311 and 312 each have the same aspect ratio, which is two times that of 309 (i.e., the aspect ratio of 309 is half that of 310, 311 and 312). Additionally, transistors 309 and 311 form the current mirror circuit 322. This configuration ensures that transistor 309 stays in the saturation region with a very low overdrive voltage, which correspondingly reduces the transistor 311 drain voltage requirement. As a result, the current source circuit 370 can operate under a low power supply (i.e., at very low voltages).

The drain of transistor 311 of current mirror circuit 322 connects to the source of transistor 314 as well as to the source of transistor 312. Digital switch 316 can be incorporated into the current source 370 structure either between the drain of 311 and the source of 314 (as illustrated in current source 370 of FIG. 3) or between the drain of 311 and the source of 312 (not shown). Since the aspect ratio of transistor 311 is two times that of transistor 309, if transistor 309 current is $I_1$, the current in transistor 311 is thus $2*I_1$ when the current sink conducts (i.e., when transistors 315 and 314 turn on). Furthermore, the transistor 311 current equals the sum of the transistor 312 current and the transistor 314 current. Since the transistor 312's drain connects to the current source $I_1$, when the current source is on (i.e., when the "Up_N" signal is high), the current in transistor 314 will be $2I_1-I_1=I_1$. This current is the charge pump source 370 current.

Digital switch 316 can also be controlled by the signal that is input to the charge pump 300 (e.g., from a phase/frequency detector (PFD) 401 of a phase locked loop (PLL) circuit 400 of FIG. 4). This switch 316 can be used to accelerate the current source cut-off speed. Specifically, switch 316 can connect to the gate of transistor 314. The control signal for 316 can be an "Up-N", which is the inverted "Up" signal that controls switch 315. That is, digital switches 315 and 316 can be toggled together by the complementary "Up" and "Up_N" signals, respectively. When "Up" is high (i.e., when "Up_N" signal is low), switch 315 turns on, switch 316 turns off and the current source is conducted. Oppositely, when "Up_N" signal is high and the "Up" signal is low, switch 315 will turn off and switch 316 will turn on. Turning switch 315 off and switch 316 on pulls down the gate of transistor 314 to GND and, thereby, shuts off the charge pump source current. When the source current path is off, transistor 314 is forced into the linear region and its current is $I_1$.

As mentioned above, the charge pump circuit 300 relies on large output resistances from both the current source circuit 370 and current sink circuit 360 (as current mirrors of the biasing circuit 390) to ensure current matching between the charging current of the current source circuit 370 and the discharging current of the current sink circuit 360. In the current source circuit 370, this large output resistance can similarly be achieved through the use of a multi-stage feedback amplifier 324. Specifically, the drain of transistor 312 is connected to the gate of transistor 313 and these two transistors 312 and 313 function as a two-stage feedback amplifier 324 that regulates the drain-source voltage of the current mirror circuit 322 (i.e., the drain voltage of transistor 314 (in the same manner as described above with regard to transistors 304 and 305 in the current sink 360) so that it is as stable as possible when the current source is on (i.e., when switch 315 is on and switch 316 is off).

As with the current sink circuit 360, one benefit of the current source circuit 370 structure is that the multi-stage feedback amplifier 324 (i.e., amplifiers 312 and 313) allows the overall feedback amplifier gain to be large. Specifically, it allows the overall feedback amplifier to be approximately equal to the product of the gains of the two distinct amplifiers, 312 and 313. Such a large feedback amplifier gain allows the current mirror of the current source 370 to be significantly increased, thereby minimizing variations between the current mirror (in this case of the current source 370) and the biasing circuit 390. Another benefit of the two-stage feedback amplifier 324 in the current source circuit 370 is that it similarly increases the output resistance of current source 370 at the output 330 which provides a very wide operation voltage range.

Referring in combination to FIG. 4 and FIG. 3, also disclosed is an embodiment of a phase locked loop (PLL) circuit 400 that incorporates the novel charge pump circuit 300 of FIG. 3, in place of a conventional charge pump. Specifically, a PLL circuit 400 is disclosed that comprises a phase frequency detector 401, a charge pump 300, a loop filter 402, a voltage control oscillator (VCO) 403 and a divide-by-M device 404. As with conventional PLL circuits, this phase frequency detector 401 can be adapted to detect a phase difference between a reference frequency 405 and a feedback frequency 407 that is output to the phase frequency detector 401 from the VCO 403 (e.g., via an optional divide-by-M device 404). The phase frequency detector 401 can be adapted to generate a correction signal (i.e., either an increase signal or a decrease signal), depending upon the phase difference detected. The charge pump circuit 300 can be connected to the phase frequency detector (e.g., via a loop filter 402). The charge pump circuit 300, as discussed in detail above, can be adapted to receive increase signals and decrease signals from the phase frequency detector 401 and to selectively adjust an output voltage based on those signals. The VCO 403 can be adapted to receive the adjusted voltage at the output node of the charge pump 300 (e.g., via a loop filter 402) and further to adjust the output frequency 406 based on that output voltage. Due to the highly matched charging and discharging currents and high output resistance in the charge pump 300, this PLL circuit 400 exhibits minimal shifts in PLL loop bandwidth and minimal degradation of PLL locking speed and jitter performance across its full frequency range.

Therefore, disclosed above are complementary current sink and current source circuits, a charge pump circuit that incorporates the current sink and current source circuits, and a phase locked loop circuit that incorporates the charge pump circuit. The current source and current sink circuits each have a current mirror circuit that biases a transistor connected to an output node. The transistor is adapted to adjust the output voltage at the output node (i.e., the transistor is either a current sink transistor or current source transistor, depending upon the type of circuit). The current sink and current source circuits each further have a two-stage feedback amplifier (e.g., a common-gate feedback amplifier connected in series with a common-source amplifier) to sense the drain voltage of the current mirror circuit and to control the gate voltage of the transistor in order to stabilize the drain voltage of the current mirror circuit independent of variations in the output voltage at the output node. In both the current sink and current source circuits, the two-stage feedback amplifier also increases the output resistance of the current mirror circuit and consequently increases the output resistance at the output node. This configuration allows for a wide operation voltage range and ensures good circuit performance under a very low power supply. Due to the increased output resistances, a charge pump circuit that incorporates the current sink and current source circuits generates highly matched charging and discharging currents. Furthermore, due to the highly matched charging and discharging currents in the charge pump circuit and high output resistance, a PLL circuit that incorporates the charge pump circuit exhibits minimal shifts in PLL loop bandwidth and minimal degradation of PLL locking speed and jitter performance across its full frequency range.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. An integrated circuit structure comprising:
an output node;
a transistor comprising a source, a drain and a gate, said drain being connected to said output node and one of increasing and decreasing an output voltage at said output node;
a current mirror circuit connected to said source of said transistor and supplying a bias current to said transistor; and
a two-stage feedback amplifier connected to said current mirror circuit and to said gate of said transistor, said two-stage feedback amplifier sensing a drain voltage of said current mirror circuit and controlling a gate voltage of said transistor in order to stabilize said drain voltage of said current mirror circuit independently of variations in said output voltage.

2. The circuit of claim 1, wherein said two-stage feedback amplifier is further configured to increase output resistance at said output node relative to a single-stage feedback amplifier.

3. The circuit of claim 1, wherein said two-stage feedback amplifier comprises a common gate amplifier connected in series with a common source amplifier.

4. The circuit of claim 3, further comprising a capacitor connected between a gate and a drain of said common source amplifier.

5. The circuit of claim 1, wherein an overall feedback amplifier gain of said two-stage feedback amplifier is approximately equal to a product of each gain from each stage of said two-stage feedback amplifier.

6. The circuit of claim 1, further comprising a digital switch connected to said source of said transistor and adapted to turn on in response to a signal in order to establish a current path from said current mirror circuit through said transistor to said output node.

7. The circuit of claim 6, further comprising an additional digital switch connected to said gate of said transistor and adapted to turn on in response to an opposite signal in order to break said current path.

8. The circuit of claim 7, wherein said digital switch and said additional digital switch comprise field effect transistors.

9. The circuit of claim 1, wherein said current mirror circuit comprises two transistors with different aspect ratios such that currents in said two transistors are proportionally different.

10. An integrated circuit structure comprising:
an output node;
a first transistor comprising a first source, a first gate and a first drain;
a second transistor comprising a second source connected to said first drain, a second gate and a second drain;
a third transistor comprising a third source connected to said first source, a third gate, and a third drain,
a fourth transistor comprising a fourth source connected to said third drain, a fourth gate and a fourth drain;
a fifth transistor comprising a fifth source connected to said first source and said third source, a fifth gate, and a fifth drain; and
a sixth transistor comprising a sixth source connected to said third drain, a sixth gate, and a sixth drain connected to said output node,
wherein said sixth transistor is adapted to one of increase and decrease an output voltage at said output node,
wherein said first gate, said second gate, said third gate and said fourth gate are each controlled by said second drain such that said first transistor and said third transistor in combination comprise a current mirror circuit, and
wherein said fifth gate is controlled by said fourth drain and said sixth gate is controlled by said fifth drain such that said fourth transistor and said fifth transistor in combination comprise a two-stage feedback amplifier adapted to sense a drain voltage of said current mirror circuit at said third drain and to control a gate voltage of said sixth transistor at said sixth gate so as to a stabilize said drain voltage of said current mirror independently of variations in said output voltage.

11. The circuit of claim 10, wherein said two-stage feedback amplifier is further configured to increase output resistance at said output node relative to a single-stage feedback amplifier.

12. The circuit of claim 10, wherein said fourth transistor comprises a common gate amplifier and wherein said fifth transistor comprises a common source amplifier.

13. The circuit of claim 10, further comprising a capacitor connected between said fifth gate and said fifth drain of said fifth transistor.

14. The circuit of claim 10, wherein an overall feedback amplifier gain of said two-stage feedback amplifier is approximately equal to a product of each gain from each stage of said two-stage feedback amplifier.

15. The circuit of claim 10, further comprising a digital switch connected to said sixth source of said sixth transistor and adapted to turn on in response to a signal in order to establish a current path from said third drain of said current mirror circuit through said sixth transistor to said output node.

16. The circuit of claim 15, further comprising an additional digital switch connected to said sixth gate of said sixth transistor and adapted to turn on in response to an opposite signal in order to break said current path.

17. The circuit of claim 16, wherein said digital switch and said additional digital switch comprise field effect transistors.

18. The circuit of claim 10, wherein said first transistor and said third transistor have different aspect ratios such that currents in said first transistor and said third transistor are proportionally different.

19. A charge pump circuit comprising:
an output node;
a current sink circuit comprising:
a first transistor comprising a first source, a first drain, and a first gate, said first drain being connected to said output node and decreasing an output voltage at said output node;

a first current mirror circuit connected to said first source of said first transistor and supply a first bias current to said first transistor; and a first two-stage feedback amplifier connected to said first current mirror circuit and to said first gate of said first transistor, said first two-stage amplifier sensing a first drain voltage of said first current mirror circuit and controlling a first gate voltage of said first transistor in order to stabilize said first drain voltage independently of variations in said output voltage;

a current source circuit comprising:

a second transistor comprising a second source, a second drain and a second gate, said second drain being connected to said output node and increasing said output voltage at said output node;

a second current mirror circuit connected to said second source of said second transistor and supplying a second bias current to said second transistor; and a second two-stage feedback amplifier connected to said second current mirror circuit and a second gate of said second transistor, said second two-stage amplifier sensing a second drain voltage of said second current mirror circuit and controlling a second gate voltage of said second transistor in order to stabilize said second drain voltage independently of variations in said output voltage; and a biasing circuit connected to said current sink circuit and said current source circuit, said biasing circuit supplying said current sink circuit and current source circuit with a same reference current.

20. The charge pump circuit of claim 19, wherein said first two-stage feedback amplifier and said second two-stage feedback amplifier are each further configured to increase output resistances of said current sink circuit and said current source circuit, respectively, at said output node relative to single-stage feedback amplifiers.

21. The charge pump circuit of claim 19, wherein said first two-stage feedback amplifier comprises a first common gate amplifier connected in series with a first common source amplifier and wherein said second two-stage feedback amplifier comprises a second common gate amplifier connected in series with a second common source amplifier.

22. The charge pump circuit of claim 21, wherein said current sink circuit comprises a first capacitor connected between a first gate and a first drain of said first common source amplifier and wherein said current source circuit comprises a second capacitor connected between a second gate and a second drain of said second common source amplifier.

23. The charge pump circuit of claim 19, wherein said first transistor comprises an N-type transistor and wherein said current sink circuit further comprises:

a first digital switch connected to a first source of said N-type transistor and adapted to turn on in response to a first signal in order to establish a first current path from said first current mirror through said N-type transistor to said output node; and a first additional digital switch connected to a first gate of said N-type transistor and adapted to turn on in response to a first opposite signal in order to break said first current path.

24. The charge pump circuit of claim 23, wherein said first digital switch and said first additional digital switch comprise N-type field effect transistors.

25. The charge pump circuit of claim 19, wherein said second transistor comprises a P-type transistor and wherein said current source circuit further comprises:

a second digital switch connected to a second source of said P-type transistor and adapted to turn on in response to a second signal in order to establish a second current path from said second current mirror through said P-type transistor to said output node; and a second additional digital switch connected to a second gate of said P-type transistor and adapted to turn on in response to a second opposite signal in order to break said second current path.

26. The charge pump circuit of claim 25, wherein said second digital switch and said second additional digital switch comprise P-type field effect transistors.

27. The charge pump circuit of claim 19, wherein said first current mirror circuit and said second current mirror circuit each comprises two transistors with different aspect ratios such that currents in said two transistors are proportionally different.

28. A phase locked loop circuit comprising:

a phase frequency detector adapted to detect a difference between a reference frequency and a feedback frequency;

a charge pump circuit connected to said phase frequency detector and adapted to receive one of an increase signal and a decrease signal from said phase frequency detector, wherein said charge pump comprises:

an output node;

a current sink circuit comprising:

a first transistor comprising a first source, a first drain, and a first gate, said first drain being connected to said output node and decreasing an output voltage at said output node in response to said decrease signal;

a first current mirror circuit connected to said first source of said first transistor and supply a first bias current to said first transistor; and a first two-stage feedback amplifier connected to said first current mirror circuit and said first gate of said first transistor, said first two-stage amplifier sensing a first drain voltage of said first current mirror circuit and controlling a first gate voltage of said first transistor in order to stabilize said first drain voltage independently of variations in said output voltage;

a current source circuit comprising:

a second transistor comprising a second source, a second drain and a second gate, said second drain being connected to said output node and increasing said output voltage at said output node in response to said increase signal;

a second current mirror circuit connected to said second source of said second transistor and supplying a second bias current to said second transistor; and a second two-stage feedback amplifier connected to said second current mirror circuit and said second gate of said second transistor, said second two-stage amplifier sensing a second drain voltage of said second current mirror circuit and controlling a second gate voltage of said second transistor in order to stabilize said second drain voltage independently of variations in said output voltage;

a biasing circuit connected to said current sink circuit and said current source circuit; said biasing circuit supplying said current sink circuit and current source circuit with a same reference current; and a voltage control oscillator receiving said output voltage and adjusting an output frequency based on said output voltage.

29. The phase locked loop circuit of claim 28, wherein said first two-stage feedback amplifier and said second two-stage feedback amplifier are each further configured to increase output resistances of said current sink circuit and said current source circuit, respectively, at said output node relative to single-stage feedback amplifiers.

30. The phase locked loop circuit of claim 28, wherein said first two-stage feedback amplifier comprises a first common gate amplifier connected in series with a first common source amplifier and wherein said second two-stage feedback amplifier comprises a second common gate amplifier connected in series with a second common source amplifier.

31. The phase locked loop circuit of claim 30, wherein said current sink circuit comprises a first capacitor connected between a first gate and a first drain of said first common source amplifier and wherein said current source circuit comprises a second capacitor connected between a second gate and a second drain of said second common source amplifier.

32. The phase locked loop circuit of claim 28, wherein said first transistor comprises an N-type transistor and wherein said current sink circuit further comprises:
   a first digital switch connected to a first source of said N-type transistor and adapted to turn on in response to a first signal in order to establish a first current path from said first current mirror circuit through said N-type transistor to said output node; and
   a first additional digital switch connected to a first gate of said N-type transistor and adapted to turn on in response to a first opposite signal in order to break said first current path.

33. The phase locked loop circuit of claim 32, wherein said first digital switch and said first additional digital switch comprise N-type field effect transistors.

34. The phase locked loop circuit of claim 28, wherein said second transistor comprises a P-type transistor and wherein said current source circuit further comprises:
   a second digital switch connected to a second source of said P-type transistor and adapted to turn on in response to a second signal in order to establish a second current path from said second current mirror circuit through said P-type transistor to said output node; and
   a second additional digital switch connected to a second gate of said P-type transistor and adapted to turn on in response to a second opposite signal in order to break said second current path, wherein said second digital switch and said second additional digital switch comprise P-type field effect transistors.

35. The phase locked loop circuit of claim 28, wherein said first current mirror circuit and said second current mirror circuit each comprises two transistors with different aspect ratios such that currents in said two transistors are proportionally different.

* * * * *